United States Patent
Chadha et al.

(10) Patent No.: US 12,469,733 B2
(45) Date of Patent: Nov. 11, 2025

(54) WAFER TO BASEPLATE ARC PREVENTION USING TEXTURED DIELECTRIC

(71) Applicant: Applied Materials, Inc., Santa Clara, CA (US)

(72) Inventors: Arvinder S. Chadha, San Jose, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 821 days.

(21) Appl. No.: 17/550,932

(22) Filed: Dec. 14, 2021

(65) Prior Publication Data

US 2023/0187250 A1 Jun. 15, 2023

(51) Int. Cl.
*H01L 21/683* (2006.01)
*H01L 21/687* (2006.01)

(52) U.S. Cl.
CPC .... *H01L 21/6833* (2013.01); *H01L 21/68735* (2013.01)

(58) Field of Classification Search
CPC ....... H01L 21/6833; H01L 21/68735
See application file for complete search history.

(56) References Cited

U.S. PATENT DOCUMENTS

| | | | |
|---|---|---|---|
| 5,675,471 A * | 10/1997 | Kotecki | H01L 21/6833 361/234 |
| 2010/0108261 A1 | 5/2010 | Augustino et al. | |
| 2011/0157760 A1 | 6/2011 | Willwerth et al. | |
| 2013/0286533 A1 * | 10/2013 | Takasaki | H01L 21/6831 361/234 |
| 2016/0118224 A1 | 4/2016 | Kohno et al. | |
| 2016/0163561 A1 * | 6/2016 | Hudson | H01L 21/3065 156/345.24 |
| 2017/0316924 A1 | 11/2017 | Cox et al. | |
| 2018/0251406 A1 * | 9/2018 | Sun | B32B 5/30 |
| 2020/0058539 A1 | 2/2020 | Rathi et al. | |
| 2020/0211885 A1 | 7/2020 | Taga et al. | |
| 2021/0292893 A1 | 9/2021 | Mitrovic et al. | |

FOREIGN PATENT DOCUMENTS

| | | | | |
|---|---|---|---|---|
| CN | 111095523 A | * | 5/2020 | ........ H01J 37/32091 |
| CN | 112908919 A | | 6/2021 | |
| JP | 2020119962 A | * | 8/2020 | ............ H01J 37/321 |
| KR | 2020-0000696 A | | 1/2020 | |
| WO | WO 2016/060960 A1 | | 4/2016 | |

OTHER PUBLICATIONS

International Search Report for PCT/US2022/051728, dated Apr. 20, 2023.

* cited by examiner

*Primary Examiner* — Eric A. Gates
(74) *Attorney, Agent, or Firm* — Moser Taboada

(57) ABSTRACT

Electrostatic chucks for use in substrate processing chambers are provided herein. In some embodiments, an electrostatic chuck for use in a substrate processing chamber includes: a dielectric plate having an electrode disposed therein, the dielectric plate further including a central portion and a peripheral portion, wherein the peripheral portion comprises at least one of: an outer sidewall having at least one asperity; a porosity greater than a porosity of the central portion of the dielectric plate; or one or more coatings made of a material different than a material of the central portion.

12 Claims, 5 Drawing Sheets

US 12,469,733 B2

WAFER TO BASEPLATE ARC PREVENTION USING TEXTURED DIELECTRIC

FIELD

Embodiments of the present disclosure generally relate to substrate processing equipment.

BACKGROUND

Substrate processing systems typically include process chambers for performing a desired process, such as an etch or deposition process, on one or more substrates disposed therein. Radio frequency (RF) power is often used in etching processes, for example, requiring very high aspect ratio holes to make contacts or deep trenches for laying infrastructure for electrical pathways. RF power can be used for plasma generation and/or for creating bias voltage on a substrate being processed to attract ions from bulk plasma. Substrate supports may include electrostatic chucks (ESCs) having one or more electrodes embedded within a dielectric plate to retain a substrate.

The ESCs may be disposed on a base plate. However, a multipactor breakdown and substrate arcing may occur due to local field enhancement at a junction between the substrate and a dielectric of the ESC thereby creating a path for electrons from the substrate to the baseplate. A multipactor breakdown occurs when electrons accelerated by RF fields are self-sustained in a vacuum (or near vacuum) via an electron avalanche caused by multiplication of secondary electron emission, causing damage to RF components.

Accordingly, the inventors have provided embodiments of improved ESCs for reducing or preventing multipactor breakdown.

SUMMARY

Electrostatic chucks for use in substrate processing chambers are provided herein. In some embodiments, an electrostatic chuck for use in a substrate processing chamber includes: a dielectric plate having an electrode disposed therein, the dielectric plate further including a central portion and a peripheral portion, wherein the peripheral portion comprises at least one of: an outer sidewall having at least one asperity; a porosity greater than a porosity of the central portion of the dielectric plate; or one or more coatings made of a material different than a material of the central portion.

In some embodiments, a substrate support for use in a substrate processing chamber includes: a baseplate; a dielectric plate having an electrode disposed therein, wherein the dielectric plate is disposed on the baseplate and includes a central portion and a peripheral portion, wherein the peripheral portion comprises at least one of: an outer sidewall having at least one asperity; a porosity greater than a porosity of the central portion of the dielectric plate; or one or more coatings made of a material different than a material of the central portion; and a process kit surrounding the baseplate and the dielectric plate.

In some embodiments, a process chamber for processing a substrate includes: a chamber body defining an inner volume therein; a substrate support disposed in the inner volume and comprising a dielectric plate having an electrode disposed therein, the dielectric plate disposed on a baseplate and including a central portion and a peripheral portion, wherein the peripheral portion comprises at least one of: an outer sidewall having at least one asperity; a porosity greater than a porosity of the central portion of the dielectric plate; or one or more coatings made of a material different than a material of the central portion; and a process kit surrounding the baseplate and the dielectric plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
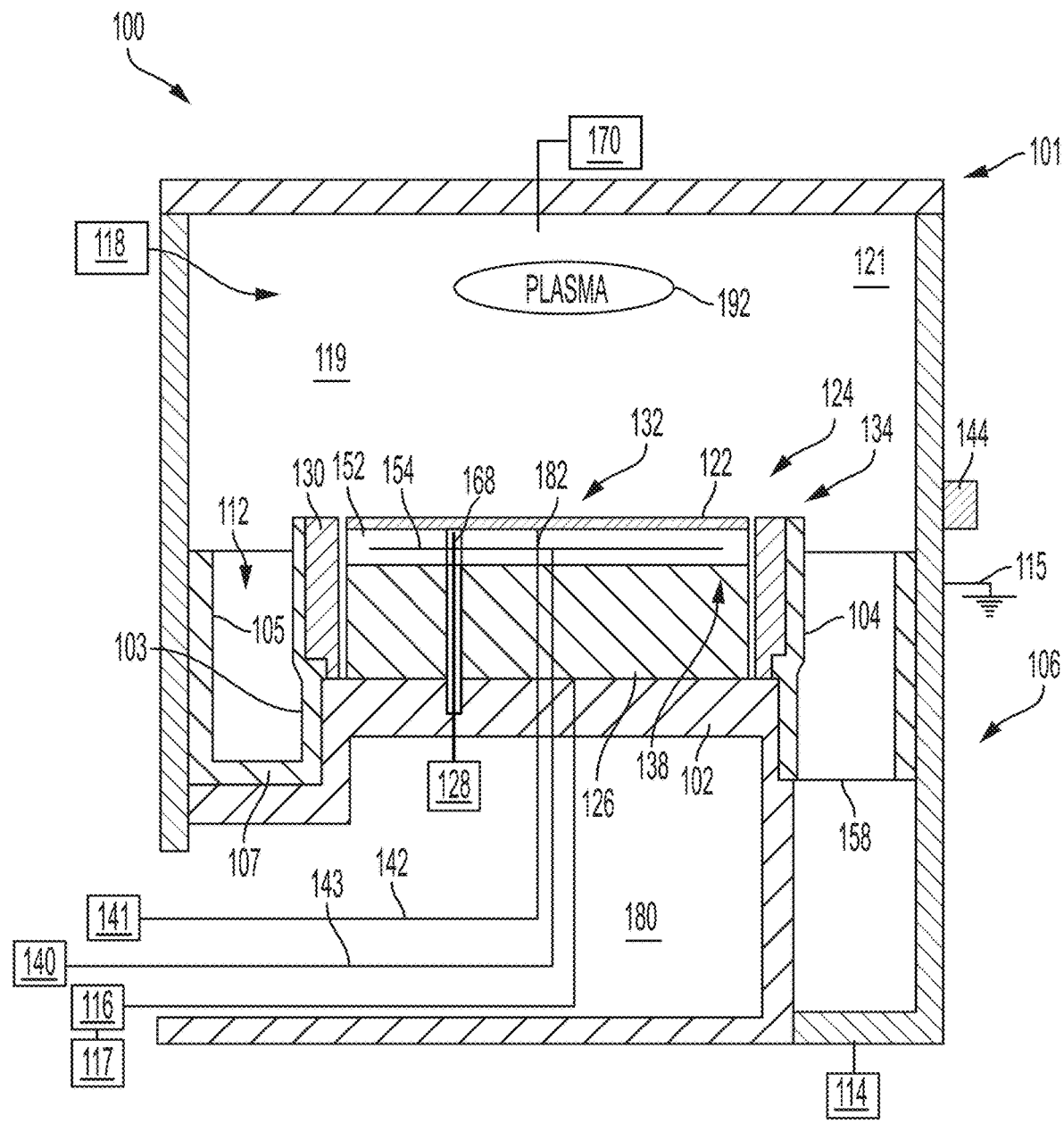
FIG. 1 depicts a schematic cross-sectional side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of dielectric plates for use in substrate processing chambers having features proximate an outer sidewall of the dielectric plates to reduce or prevent substrate arcing are provided herein. Gaps formed between the dielectric plate and other chamber components disposed about the dielectric plate (e.g., a process kit component) due to tolerances between parts or asymmetry due to tolerances may provide a path for electrons to flow and multiply from a substrate disposed on the dielectric plate to a baseplate disposed below the dielectric plate. An outer sidewall of the dielectric plate being planar does not disrupt the path of electrons and instead creates a straight path for electrical conduction between the substrate and the baseplate. The inventive features provided herein are configured to disrupt the path for electrons, thus preventing generation of secondary electrons and multipactor breakdown. The features may comprise, for example, texturing, coatings, changes in porosity, or the like, proximate the outer sidewall or on the outer sidewall of the dielectric plate.

FIG. 1 depicts a schematic cross-sectional side view of a process chamber 100 in accordance with at least some embodiments of the present disclosure. In some embodiments, the process chamber 100 is an etch processing chamber. However, other types of processing chambers configured for different processes can also use or be modified for use with embodiments of the substrate supports described herein.

The process chamber 100 may be a vacuum chamber which is suitably adapted to maintain sub-atmospheric pressures within an interior volume 121 during substrate processing. The process chamber 100 includes a chamber body 106 covered by a lid 101 which encloses a processing volume 119 located in the upper half of the interior volume 121. The process chamber 100 may also include one or more shields (not shown) circumscribing various chamber components to prevent unwanted reaction between such components and ionized process material. The chamber body 106 and lid 101 may be made of metal, such as aluminum. The chamber body 106 may be grounded via a coupling to ground 115.

A substrate support 124 is disposed in the interior volume 121 to support and retain a substrate 122, such as a semiconductor wafer, for example, or other substrate. The substrate support 124 may generally comprise a dielectric plate 152 disposed on a base plate 126. In some embodiments, the base plate 126 comprises a metallic material, for example Aluminum (Al). In some embodiments, the base plate 126 is disposed on a support plate 102 of the chamber body 106. In some embodiments, the base plate 126 may be a cooling plate having cooling channels disposed therein and configured to circulate a cooling to cool the dielectric plate 152.

An upper surface of the substrate support 124 (e.g., upper surface of the dielectric plate 152) is exposed to the processing volume 119. In some embodiments, the dielectric plate 152 includes one or more electrodes 154 disposed therein configured to electrostatically chuck the substrate 122 to the dielectric plate 152. The one or more electrodes 154 may be monopolar or bipolar. The dielectric plate 152 includes a central portion 132 and a peripheral portion 138 disposed about the central portion 132. The dielectric plate 152 may comprise a J-R dielectric or a coulombic dielectric.

In some embodiments, the support plate 102, together with the chamber body 106, define a lower volume 180 of the process chamber 100 below the support plate 102. In some embodiments, the lower volume 180 may be at atmospheric pressure during use. Various conduits may extend to the substrate support 124 via the lower volume 180 to provide, for example, backside gases, process gases, fluids, coolants, power, or the like, to the substrate support 124. In some embodiments, the various conduits may include conduits for a backside gas supply 141, a chucking power supply 140, a RF plasma power supply 170, and a bias power supply 117. The chucking power supply 140 may be coupled to the one or more electrodes 154 via chucking electrode lines 143.

The RF plasma power supply 170 may alternatively, or in addition, be provided to the process chamber 100 via the lid 101 or upper portion of the chamber body 106. In some embodiments, the bias power supply 117 includes one or more RF bias power sources. In some embodiments, RF energy supplied by the RF plasma power supply 170 may have a frequency of about 400 kHz to over 40 MHz. In some embodiments, the RF plasma power supply 170 and the bias power supply 117 are coupled to the pedestal 150 via respective RF match networks (only RF match network 116 shown). In some embodiments, the substrate support 124 may alternatively include AC, DC, or RF bias power. In some embodiments, the AC, DC, or RF bias power may be pulsed.

The substrate support 124 may include a plurality of substrate lift pins 168 extending through the substrate support 124. A lift mechanism 128 may be coupled to the plurality of substrate lift pins 168 and configured to selectively raise or lower the substrate 122 via the lift pins. In some embodiments, the plurality of substrate lift pins 168 comprise three lift pins that are disposed symmetrically about the substrate support 124. In some embodiments, the substrate support 124 includes a process kit 134 comprising one or more components disposed about the dielectric plate 152. In some embodiments the process kit 134 is disposed about the base plate 126 and the dielectric plate 152.

In some embodiments, the substrate support 124 may include a liner 104 disposed about, or surrounding, the dielectric plate 152. In some embodiments, one or more of the liner 104 and the support plate 102 are grounded during use. In some embodiments, the liner 104 comprises an inner wall 103 and an outer wall 105 defining an annular channel 112 therebetween. In some embodiments, the inner wall 103 and the outer wall 105 are coupled to a lower plate 107 of the liner 104. The process chamber 100 includes a vacuum pump 114 fluidly coupled to the processing volume 119 to exhaust the processing volume 119. In some embodiments, the lower plate 107 includes one or more pump ports 158 coupled to the vacuum pump 114 for exhausting the processing volume 119. The pressure inside the processing volume 119 may be regulated by adjusting a throttle valve of the vacuum pump 114.

In some embodiments, the process kit 134 include a first ring 130 disposed about the dielectric plate 152. The first ring 130 may isolate the dielectric plate 152 and the base plate 126 from the plasma environment of the processing volume 119. In some embodiments, the first ring 130 may support an edge ring or the like disposed about the substrate 122. The first ring 130 may be a quartz ring, a sapphire ring, or a composite ring comprising one or more of oxide, carbide, or metal materials (e.g., alumina and silicon carbide (SiC), quartz and aluminum, or the like).

In some embodiments, substrate support 124 includes gas distribution channels 182 extending from a lower surface of the pedestal 150 (e.g., bottom surface of the base plate 126) to various openings in an upper surface of the pedestal 150. The gas distribution channels 182 are configured to provide backside gas, such as nitrogen (N) or helium (He), to the upper surface of the dielectric plate 152 to act as a heat transfer medium. The gas distribution channels 182 are in fluid communication with the backside gas supply 141 via gas conduit 142 to control the temperature and/or temperature profile of the substrate support 124 during use.

The processing volume 119 is also coupled to and in fluid communication with a process gas supply 118 which may supply one or more process gases to the process chamber 100 for processing a substrate disposed therein. In some embodiments, the process gas supply 118 may supply one or more process gases to the processing volume 119 via a showerhead (not shown) for more uniform gas distribution. The process chamber 100 includes a slit valve 144 to facilitate transferring the substrate 122 into and out of the interior volume 121. In some embodiments, a transfer robot (not shown) is configured to transfer the substrate 122. The transfer robot may also advantageously be configured to transfer the edge ring 185 into and out of the interior volume 121 for replacement. The slit valve 144 may be coupled to the lid 101 or chamber body 106.

In operation, for example, a plasma 192 may be created in the processing volume 119 to perform one or more processes. The plasma 192 may be created by coupling power from a plasma power source (e.g., RF plasma power supply 170) to a process gas via one or more electrodes near or within the processing volume 119 to ignite the process gas and create the plasma 192. A bias power may be provided from a bias power supply (e.g., bias power supply 117) to the pedestal 150 to attract ions from the plasma 192 towards the substrate 122. The bias power supply 117 may supply bias power to the edge ring 185 and the dielectric plate 152. For example, the bias power supply 117 may comprise a single power supply that is shared by both the edge ring 185 and the dielectric plate 152.

Figure 2:
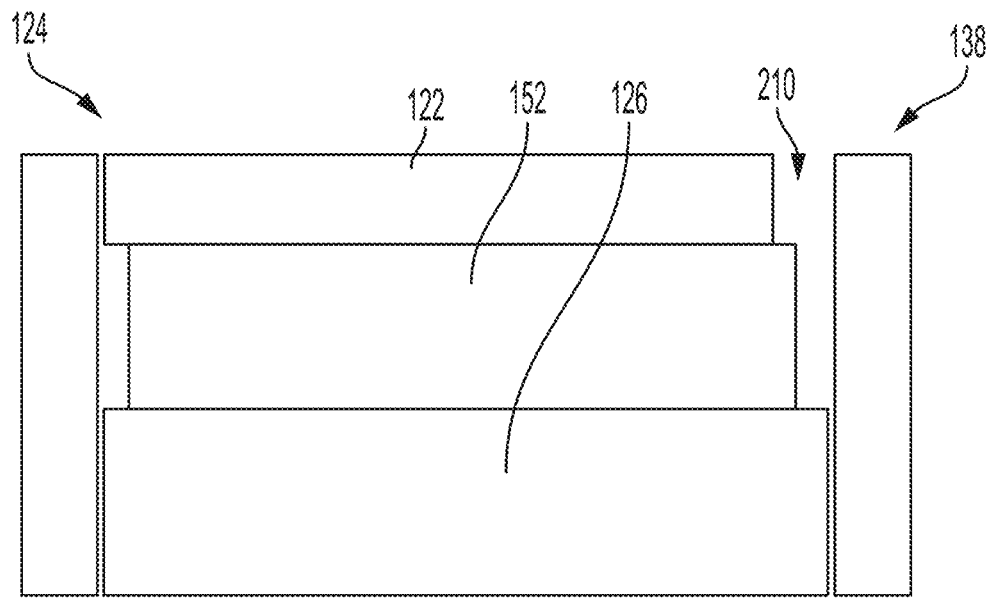
FIG. 2 depicts a schematic cross-sectional view of a substrate support in accordance with at least some embodiments of the present disclosure.
Figure 3:
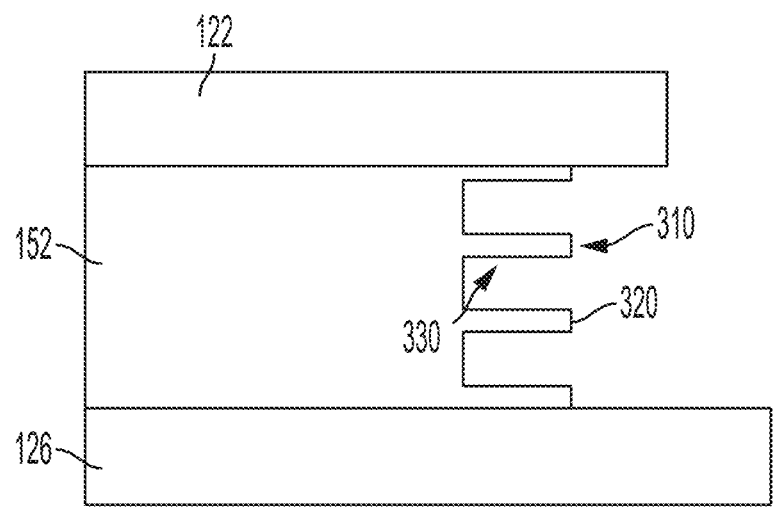
FIG. 3 depicts a schematic cross-sectional view of a substrate support in accordance with at least some embodiments of the present disclosure.

FIG. 2 depicts a schematic cross-sectional view of a substrate support 124 in accordance with at least some embodiments of the present disclosure. A gap 210 may be disposed between the dielectric plate 152 and the process kit 134 disposed about the dielectric plate 152 due to tolerances of parts. In some embodiments, an aspect ratio of the dielectric plate 152 is about 0.001 to about 1000. In some embodiments, an aspect ratio of the dielectric plate 152 is about 0.1 to about 10. FIG. 3 depicts a schematic cross-sectional view of a substrate support in accordance with at least some embodiments of the present disclosure. In some embodiments, an outer sidewall 310 of the dielectric plate 152 includes at least one asperity 320 which reduces or prevents multiplication of secondary electron emission 340 and therefore advantageously prevents multipactor breakdown.

In some embodiments, as shown in FIG. 3, the at least one asperity 320 comprises a plurality of asperities having rectangular shapes 330. The at least one asperity 320 may have hemispherical shapes, moth eye shapes, rectangular shapes, ellipsoid shapes, truncated ellipse shapes, or the like. In some embodiments, a surface roughness of the outer sidewall 310 is about 0.2 to about 100 microns to reduce multiplication of secondary electron emission. In some embodiments, the surface roughness of the outer sidewall 310 is larger than a surface roughness of an upper or lower surface of the dielectric plate. In some embodiments, the at least one asperity 320 comprises a plurality of asperities arranged periodically. In some embodiments, the at least one asperity 320 is arranged randomly.

Figure 4A:
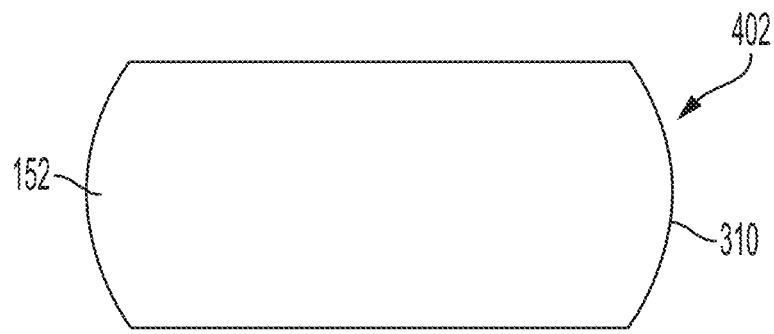
FIG. 4A depicts a schematic cross-sectional view of a dielectric plate in accordance with at least some embodiments of the present disclosure.
Figure 4B:
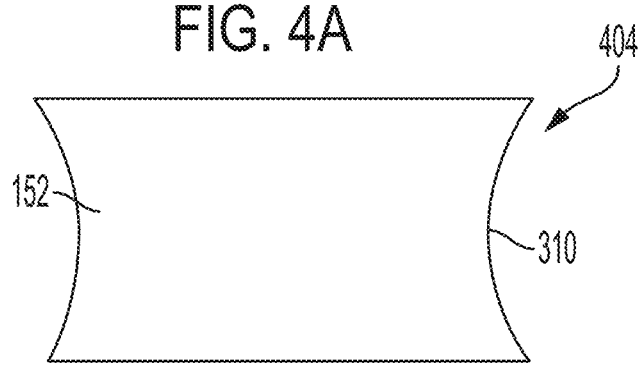
FIG. 4B depicts a schematic cross-sectional view of a dielectric plate in accordance with at least some embodiments of the present disclosure.
Figure 4C:
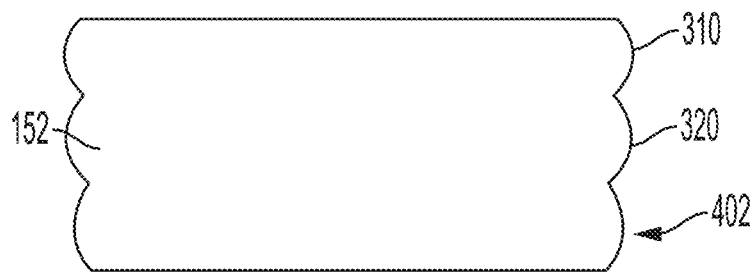
FIG. 4C depicts a schematic cross-sectional view of a dielectric plate in accordance with at least some embodiments of the present disclosure.
Figure 4D:
FIG. 4D depicts a schematic cross-sectional view of a dielectric plate in accordance with at least some embodiments of the present disclosure.
Figure 4E:
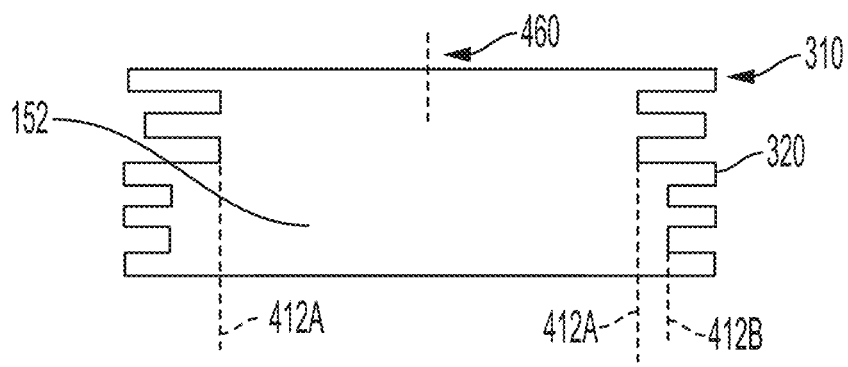
FIG. 4E depicts a schematic cross-sectional view of a dielectric plate in accordance with at least some embodiments of the present disclosure.

The at least one asperity 320 may comprise any suitable shape or arrangement of shapes suitable for reducing or preventing multiplication of electrons from secondary emissions. For example, FIGS. 4A through 4E depict schematic cross-sectional views of a dielectric plate 152 in accordance with at least some embodiments of the present disclosure. In some embodiments, the at least one asperity 320 has a convex shape 402 as depicted in FIG. 4A. In some embodiments, the at least one asperity 320 has a concave shape 404 as depicted in FIG. 4B. In some embodiments, the at least one asperity 320 has a plurality of asperities having convex shapes 402, as depicted in FIG. 4C. In some embodiments, the at least one asperity 320 has a plurality of asperities having concave shapes 404. In some embodiments, the at least one asperity 320 comprises a plurality of asperities having a gap 420 disposed between each of the plurality of asperities, as depicted in FIG. 4D. In some embodiments, the at least one asperity 320 comprises a plurality of asperities extending radially outward along imaginary cylindrical surfaces 412A, 412B of the outer sidewall 310, wherein the imaginary cylindrical surfaces 412A, 412B are coaxial with and have different radii with respect to a central axis 460 of the dielectric plate 152.

Figure 5A:
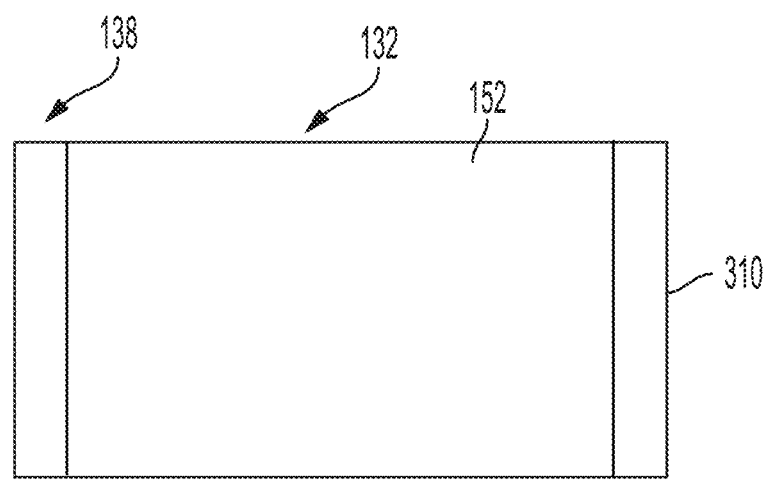
FIG. 5A depicts a schematic cross-sectional view of a dielectric plate in accordance with at least some embodiments of the present disclosure.

FIG. 5A depicts a schematic cross-sectional view of a dielectric plate 152 in accordance with at least some embodiments of the present disclosure. In some embodiments, a porosity of the peripheral portion 138 of the dielectric plate 152 is greater than a porosity of the central portion 132 of the dielectric plate 152. The increased porosity of the peripheral portion 138 increases an effective electric length of the outer sidewall 310, thereby reducing or preventing multipactor breakdown. In some embodiments, the porosity of the peripheral portion 138 is about 1 percent to about 10 percent porous by volume of voids over total volume. In some embodiments, the porosity of the central portion 132 is less than about 1 percent porous by volume of voids over total volume. In some embodiments, the central portion 132 is made of a same material as the peripheral portion 138. For example, the dielectric plate 152 may be etched to increase the porosity of the peripheral portion 138. In some embodiments, the peripheral portion 138 is made of a different material than the central portion 132. In some embodiments, a width of the peripheral portion 138 is about 3 mm to about 10 mm.

Figure 5B:
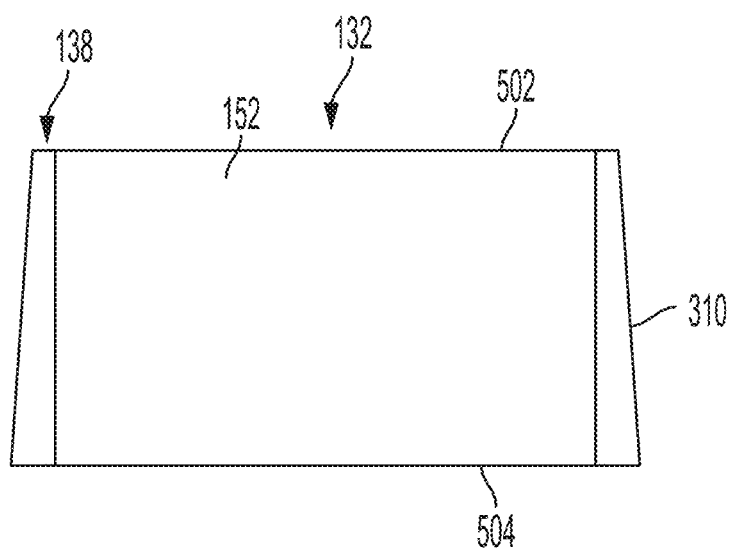
FIG. 5B depicts a schematic cross-sectional view of a dielectric plate in accordance with at least some embodiments of the present disclosure.

FIG. 5B depicts a schematic cross-sectional view of a dielectric plate in accordance with at least some embodiments of the present disclosure. In some embodiments, the porosity of the peripheral portion 138 is greater than the porosity at the central portion 132, and a thickness of the peripheral portion 138 changes from a top 502 of the dielectric plate 152 to a bottom 504 of the dielectric plate 152. In some embodiments, the thickness of the peripheral portion 138 increases from the top 502 to the bottom 504. In such embodiments, the outer sidewall 310 of the dielectric plate 152 may extend linearly downward and radially outward. In some embodiments, the outer sidewall 310 of the dielectric plate 152 may include the at least one asperity 320 and include the peripheral portion 138 having a porosity greater than the porosity of the central portion 132.

Figure 6:
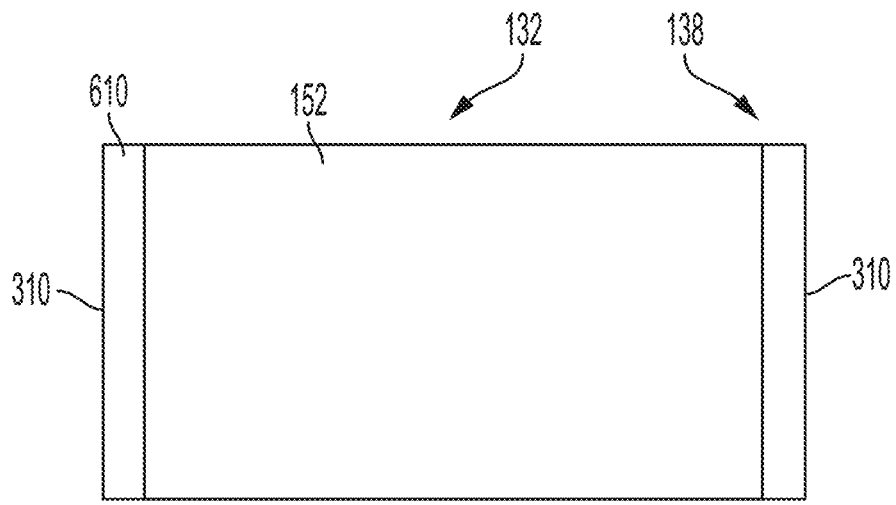
FIG. 6 depicts a schematic cross-sectional view of a dielectric plate in accordance with at least some embodiments of the present disclosure.

FIG. 6 depicts a schematic cross-sectional view of a dielectric plate 152 in accordance with at least some embodiments of the present disclosure. In some embodiments, the dielectric plate 152 includes one or more coatings 610 made of a material different than a material of the central portion 132. The one or more coatings 610 are generally made of material that have an activation energy of greater than about 0.1 electron-volts (eV) to minimize charge transport to reduce or prevent multiplication of electrons from secondary emissions. In some embodiments, the one or more coatings 610 comprise titanium oxide, titanium nitride, aluminum oxide, molybdenum oxide, or chromium oxide.

Figure 7:
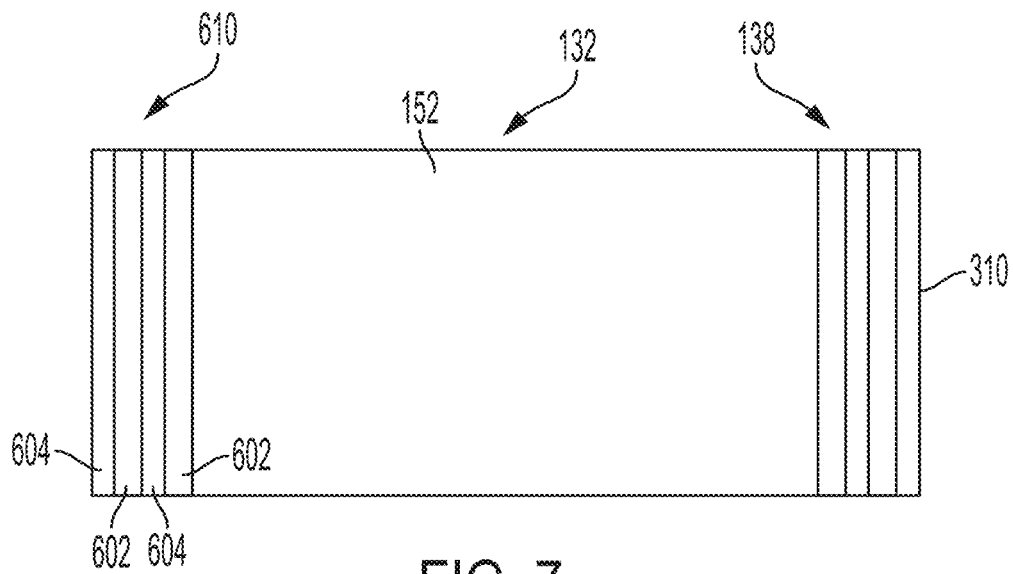
FIG. 7 depicts a schematic cross-sectional view of a dielectric plate in accordance with at least some embodiments of the present disclosure.

FIG. 7 depicts a schematic cross-sectional view of a dielectric plate 152 in accordance with at least some embodiments of the present disclosure. In some embodiments, the one or more coatings 610 comprise alternating layers of a first layer 602 and a second layer 604. In some embodiments, the first layer 602 is a nitride layer and the second layer 604 is an oxide layer. In some embodiments, the first layer 602 is an oxide layer and the second layer 604 is a nitride layer. In some embodiments, the first layer 602 is a nitride layer and the second layer 604 is a metal layer. In some embodiments, the first layer 602 is a metal layer. In some embodiments, the oxide layer consists essentially of titanium oxide, aluminum oxide, molybdenum oxide, or chromium oxide. In some embodiments, the nitride layer consists essentially of titanium nitride. In some embodiments, the metal layer consists essentially of silver (Ag) or gold (Au).

While the foregoing is directed to embodiments of the present disclosure, other and further embodiments of the disclosure may be devised without departing from the basic scope thereof.

The invention claimed is:

1. An electrostatic chuck for use in a substrate processing chamber, comprising:
    a dielectric plate having an electrode disposed therein, the dielectric plate further including a central portion and a peripheral portion, wherein the peripheral portion comprises an outer sidewall having at least one asperity, wherein the at least one asperity is disposed between an upper surface and a lower surface of the dielectric plate and extends beth radially outward from the outer sidewall; and
    wherein at least one of:
        the at least one asperity comprises a plurality of asperities extending radially outward along imaginary cylindrical surfaces of the outer sidewall, wherein the imaginary cylindrical surfaces are coaxial with and have different radii with respect to a central axis of the dielectric plate; or
        the at least one asperity comprises a plurality of asperities arranged periodically; or
        the at least one asperity comprises a plurality of asperities having hemispherical shapes, moth eye shapes, rectangular shapes, ellipsoid shapes, or truncated ellipse shapes; or
        the at least one asperity comprises a plurality of asperities having a gap disposed between each of the plurality of asperities.

2. The electrostatic chuck of claim 1, wherein the at least one asperity has a concave shape or a convex shape.

3. The electrostatic chuck of claim 1, wherein at least one of:
    the at least one asperity comprises a plurality of asperities extending radially outward along imaginary cylindrical surfaces of the outer sidewall, wherein the imaginary cylindrical surfaces are coaxial with and have different radii with respect to a central axis of the dielectric plate, or
    the at least one asperity comprises a plurality of asperities arranged periodically.

4. The electrostatic chuck of claim 1, wherein the at least one asperity comprises a plurality of asperities having hemispherical shapes, moth eye shapes, rectangular shapes, ellipsoid shapes, or truncated ellipse shapes.

5. The electrostatic chuck of claim 1, wherein the at least one asperity comprises a plurality of asperities having a gap disposed between each of the plurality of asperities.

6. The electrostatic chuck of claim 1, wherein a width of the peripheral portion is 3 mm to 10 mm.

7. A substrate support for use in a substrate processing chamber, comprising:
    a baseplate;
    a dielectric plate having an electrode disposed therein, wherein the dielectric plate is disposed on the baseplate and includes a central portion and a peripheral portion, wherein the peripheral portion comprises an outer sidewall having at least one asperity, wherein the at least one asperity extends radially outward from the outer sidewall; and
    wherein at least one of:
        the at least one asperity comprises a plurality of asperities extending radially outward along imaginary cylindrical surfaces of the outer sidewall, wherein the imaginary cylindrical surfaces are coaxial with and have different radii with respect to a central axis of the dielectric plate; or
        the at least one asperity comprises a plurality of asperities arranged periodically; or
        the at least one asperity comprises a plurality of asperities having hemispherical shapes, moth eye shapes, rectangular shapes, ellipsoid shapes, or truncated ellipse shapes; or
        the at least one asperity comprises a plurality of asperities having a gap disposed between each of the plurality of asperities.

8. The substrate support of claim 7, further comprising a process kit, wherein the process kit is a quartz ring, a sapphire ring, or a composite ring comprising one or more of oxide, carbide, or metal materials.

9. The substrate support of claim 7, wherein the central portion is made of a same material as the peripheral portion.

10. The substrate support of claim 7, wherein a surface roughness of the outer sidewall is 0.2 to 100 microns.

11. The substrate support of claim 7, wherein an aspect ratio of the dielectric plate is 0.1 to 10.

12. A process chamber for processing a substrate, comprising:
    a chamber body defining an inner volume therein;
    a substrate support disposed in the inner volume and comprising a dielectric plate having an electrode disposed therein, the dielectric plate disposed on a baseplate and including a central portion and a peripheral portion, wherein the peripheral portion comprises an outer sidewall having at least one asperity;
    a process kit surrounding the baseplate and the dielectric plate; and
    wherein at least one of:
        the at least one asperity comprises a plurality of asperities extending radially outward along imaginary cylindrical surfaces of the outer sidewall, wherein the imaginary cylindrical surfaces are coaxial with and have different radii with respect to a central axis of the dielectric plate; or
        the at least one asperity comprises a plurality of asperities arranged periodically; or
        the at least one asperity comprises a plurality of asperities having hemispherical shapes, moth eye shapes, rectangular shapes, ellipsoid shapes, or truncated ellipse shapes; or
        the at least one asperity comprises a plurality of asperities having a gap disposed between each of the plurality of asperities.

* * * * *